United States Patent
Coffa et al.

(10) Patent No.: US 6,943,390 B2
(45) Date of Patent: Sep. 13, 2005

(54) HIGH-GAIN PHOTODETECTOR WITH SEPARATED PN JUNCTION AND RARE EARTH DOPED REGION AND A METHOD OF FORMING THE SAME

(75) Inventors: Salvatore Coffa, Tremestieri Etneo (IT); Sebania Libertino, Catania (IT); Ferruccio Frisina, Sant'Agata Li Battiati (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 124 days.

(21) Appl. No.: 10/142,264

(22) Filed: May 8, 2002

(65) Prior Publication Data

US 2002/0185700 A1 Dec. 12, 2002

(30) Foreign Application Priority Data

May 15, 2001 (EP) .............................. 01830308

(51) Int. Cl.⁷ ............................. H01L 27/148
(52) U.S. Cl. ......................... 257/233; 438/48
(58) Field of Search ................. 257/230–260; 438/48

(56) References Cited

U.S. PATENT DOCUMENTS 6,340,826 B1 * 1/2002 Iliadis

FOREIGN PATENT DOCUMENTS

EP 1 081 812 A1 3/2001
JP 10-125940 5/1998

OTHER PUBLICATIONS

Franzo, G. et al., "Mechanism and Performance of Forward and Reverse Bias Electroluminescence at 1.54 μm from Er–Doped Si Diodes," *Journal of Applied Physics*, 81 (6):2784–2793, Mar. 15, 1997.

Coffa, S. et al., "Direct Evidence of Impact Excitation and Spatial Profiling of Excited Er in Light Emitting Si Dioides," *Applied Physics Letters*, 73(1):93–95, Jul. 1998.

* cited by examiner

*Primary Examiner*—Fetsum Abraham
(74) *Attorney, Agent, or Firm*—Lisa K. Jorgensen; Timothy L. Boller; Seed IP Law Group PLLC (57) ABSTRACT

The high-gain photodetector is formed in a semiconductor-material body which houses a PN junction and a sensitive region that is doped with rare earths, for example erbium. The PN junction forms an acceleration and gain region separate from the sensitive region. The PN junction is reverse-biased and generates an extensive depletion region accommodating the sensitive region. Thereby, the incident photon having a frequency equal to the absorption frequency of the used rare earth crosses the PN junction, which is transparent to light, can be captured by an erbium ion in the sensitive region, so as to generate a primary electron, which is accelerated towards the PN junction by the electric field present, and can, in turn, generate secondary electrons by impact, according to an avalanche process. Thereby, a single photon can give rise to a cascade of electrons, thus considerably increasing detection efficiency.

10 Claims, 6 Drawing Sheets

HIGH-GAIN PHOTODETECTOR WITH SEPARATED PN JUNCTION AND RARE EARTH DOPED REGION AND A METHOD OF FORMING THE SAME

BACKGROUND OF THE INVENTION

1. Field of the Invention

The present invention relates to a high-gain photodetector of semiconductor material and to a manufacturing process thereof.

2. Description of the Related Art

As is known, silicon is currently the main material used for manufacturing integrated electronic components and it is used for implementing a large variety of electrical functions.

At present, a new optical-communication technology is emerging wherein the elementary information is carried by optical signals. Wavelengths for optical communications are in the 1.3 to 1.55 $\mu$m range. It is moreover desirable to combine optical and electronic functions in a single silicon device, by combining electronic technologies and optical technologies.

High-internal-gain detectors are required for different applications, such as single-photon counting and quantum computing. Avalanche photodetectors (APDs) with internal gain up to $10^5$ are particularly suitable for the purpose. Silicon-based avalanche photodetectors can, however, operate only at wavelengths of less than 1 $\mu$m. However, in applications such as data transmission in an optical-fiber system, different wavelengths are required, as mentioned previously. For such applications, compound semiconductor-based avalanche photodetectors are therefore used, where the compound semiconductor materials are typically ternary compounds of In, Ga, and As, in so far as such materials present high absorption levels at these frequencies. One advantage of avalanche photodetectors lies in the fact that it is possible to completely separate the acceleration region (where the electric field is maximum) from the absorption region.

It has moreover been demonstrated that rare earth ions, incorporated into silicon in the trivalent state, have well-defined electronic transitions due to the presence of a non-complete 4f shell. For example, erbium incorporated in the trivalent state has a first excitation state at 0.8 eV (corresponding to 1.54 $\mu$m) with respect to the ground state. This transition energy depends upon the specific rare earth ions, and, for example, it is approximately 1.2 eV for ytterbium (Yb), 1.16 eV for holmium (Ho), and 1.37 eV for neodymium (Nd). These transitions may be excited both optically and electrically, using a charge-carrier mediated process.

Figure 1A:
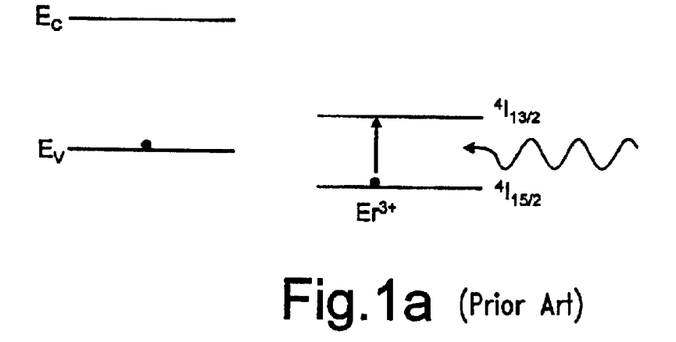
FIGS. 1a, 1b and 1c show a photoconversion mechanism used in the present detector.
Figure 1B:
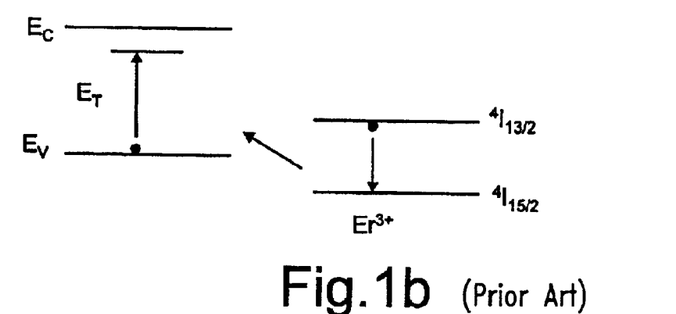
Figure 1C:
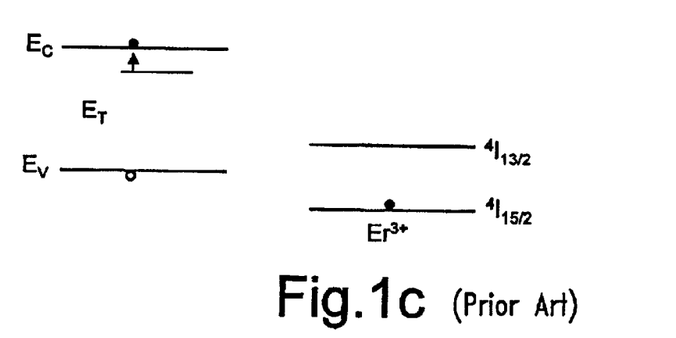

For greater clarity, the optical-excitation process is described that occurs when a photon having an energy resonating with the transition energy of rare-earth ions produces excitation of the ion from its ground state to its first excited state. This process is schematically illustrated in FIGS. 1a–1c in the specific case of erbium. In FIG. 1a, a photon having an energy of 1.54 $\mu$m and incident on an erbium doped region, is absorbed by an erbium ion, which is excited. The excited erbium ion may subsequently get de-excited, transferring its energy to the electronic system of the semiconductor. In the example illustrated, the erbium ion, during de-excitation, releases its energy to an electron which is at the top of the valence band (energy $E_V$) bringing it to a defect level $E_T$ in the silicon band gap (FIG. 1b). Next, it may happen that the electron that is in the defect level absorbs thermal energy so that it passes from the defect level $E_T$ to the conduction band $E_C$ (FIG. 1c). Altogether, in the process illustrated, absorption of a photon at 1.54 $\mu$m leads to the generation of a free electron-hole pair. This electron-hole pair can then be separated and attracted by the electric field present in the region accommodating the rare-earth ion, thus giving rise to an electric current which can be detected and which is directly proportional to the intensity of infrared light.

The process of conversion of infrared light into electric current described above has been demonstrated in silicon solar cells doped with erbium, for which photocurrents have been obtained having a wavelength of approximately 1.54 $\mu$m. However, in these cells the conversion efficiency is very low, of about $10^{-6}$, and is not sufficient for implementation in commercial devices.

European Patent Application No. EP-A-0 993 053 entitled "Infrared Detector Integrated With a Waveguide and Method for Manufacturing," filed on Sep. 1, 1998, herein incorporated by reference in its entirety, describes a waveguide structure able to detect infrared light in a silicon detector and using the process described above with reference to FIGS. 1a–1c.

Figure 2A:
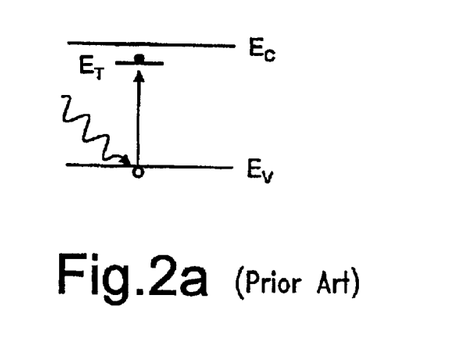
FIGS. 2a and 2b show a different photoconversion mechanism used in the present detector.
Figure 2B:
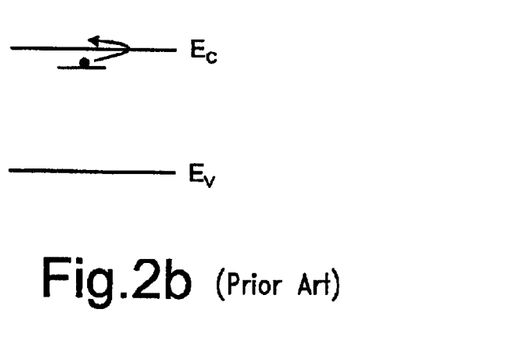

Another mechanism for light detection mediated by rare earths occurs when a photon directly excites an electron which is at the top of the valence band (energy $E_V$), bringing it to the defect level $E_T$ (FIG. 2a). Also in this case, subsequently it may happen that the electron that is in the defect level goes into the conduction band $E_C$ by absorbing thermal energy (FIG. 2b). Also in this case, therefore, absorption of a photon at 1.54 $\mu$m leads to the generation of a free electron-hole pair.

BRIEF SUMMARY OF THE INVENTION

The aim of the present invention is to provide an improved photodetector which is able to detect light at preset frequencies and which moreover has high detection efficiency. According to the present invention there are provided a photodetector of semiconductor material and a manufacturing process thereof. Aspects include a photodetector comprising a semiconductor material body housing a PN junction and a sensitive region that is doped with rare earths. The PN junction forms an acceleration and gain region separated from said sensitive region. Further aspects include a process for manufacturing a photodetector, comprising forming a PN junction in a semiconductor-material body; and forming a sensitive region doped with rare earths in said semiconductor-material body, the sensitive region being formed separately from said PN junction.

For a better understanding of the present invention, preferred embodiments thereof are now described, purely to provide non-limiting examples, with reference to the attached drawings, wherein:

DETAILED DESCRIPTION OF THE INVENTION

Figure 3:
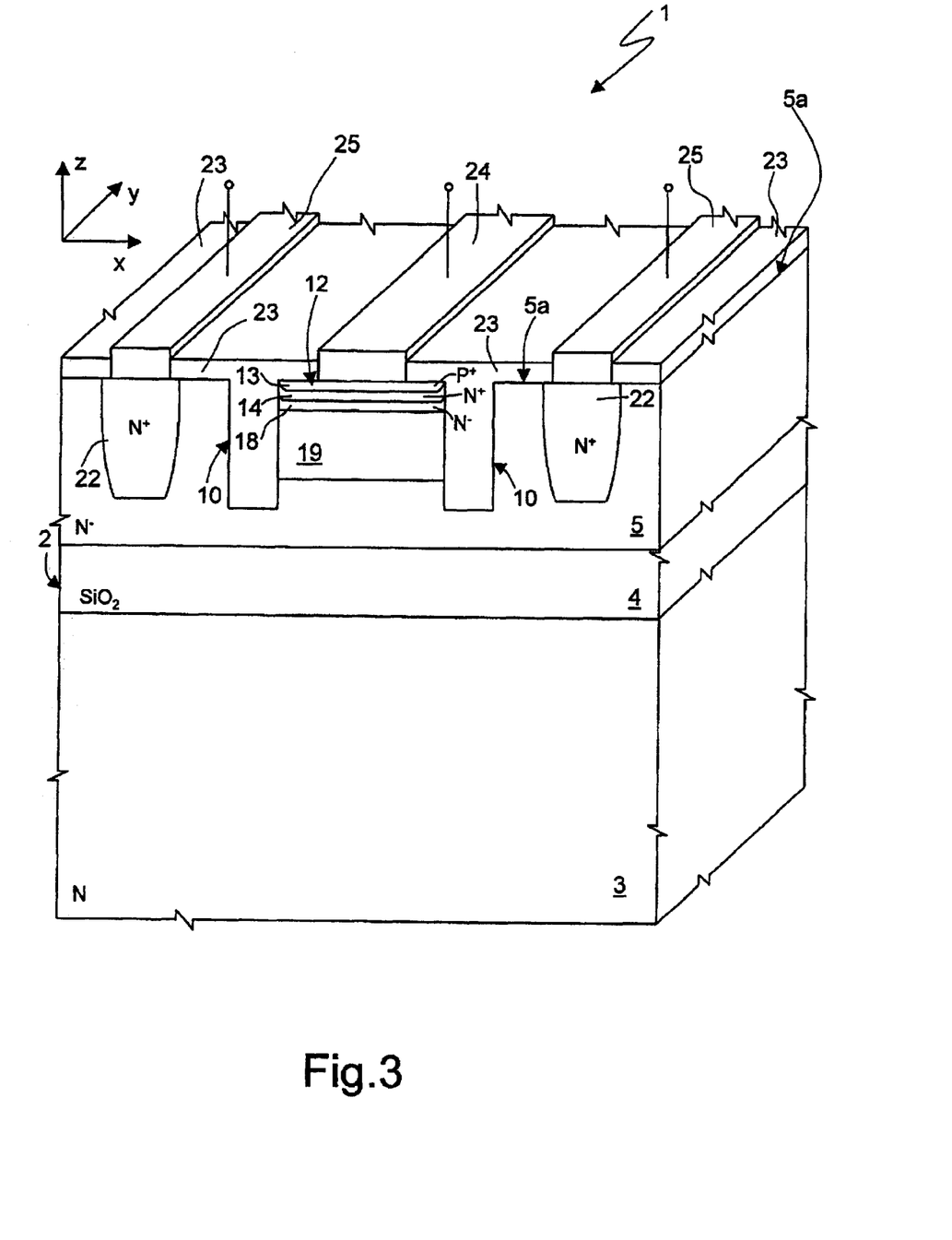
FIG. 3 is a cross-section of a first embodiment of the present photodetector.

FIG. 3 shows a cross-section of a portion of an integrated device housing a photodetector according to the invention.

In particular, as shown in FIG. 3, the photodetector, designated by 1, is formed in a silicon-on-insulator (SOI) substrate 2 including a first monocrystalline region 3 of N-type, an oxide region 4, and a second monocrystalline region 5 of N$^-$-type, which has a top surface 5a.

Two trenches 10 extend inside the second monocrystalline region 5 and delimit laterally between them and active region 12 of the photodetector. The active region 12 comprises a surface region 13 of P$^+$-type facing the top surface 5a of the second monocrystalline region 5; a junction region 14 of N$^+$-type arranged directly beneath, and contiguous to, the surface region 13; a separation region 18 formed by the second monocrystalline region 5, and thus of the N$^-$-type; and a sensitive region 19, doped with a rare earth, for example erbium (Er), holmium (Ho), neodymium (Nd), or promethium (Pm).

Formed outside the trenches 10 are biasing regions 22, of the N$^-$-type. An insulating layer 23, for example of deposited silicon dioxide, extends on the top surface 5a of the second monocrystalline region 5 and inside the trenches 10. In addition, on top of the surface region 13 and biasing regions 22, the insulating layer 23 has through openings accommodating a first metal contact 24 and, respectively, second metal contacts 25.

Figure 4:
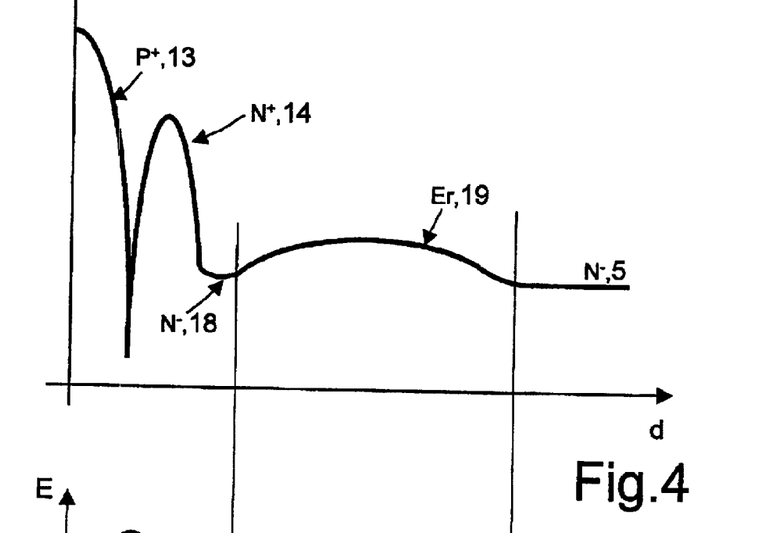
FIG. 4 shows the dopant profile along a transverse direction.
Figure 5:
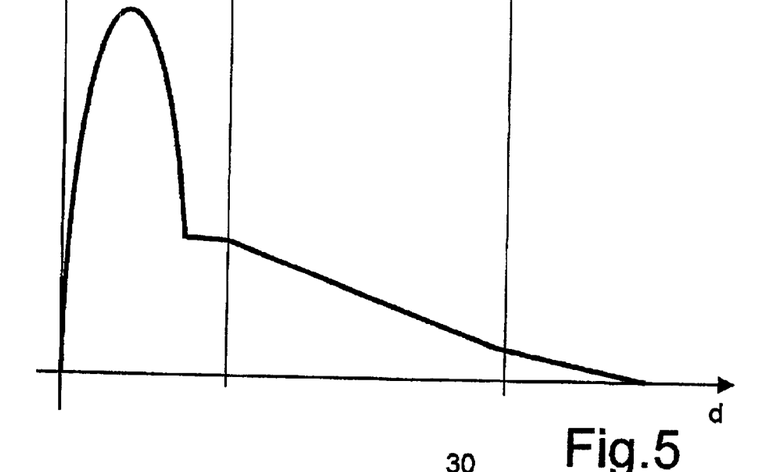
FIG. 5 shows the plot of the electric field along the same transverse direction as FIG. 4.
Figure 6:
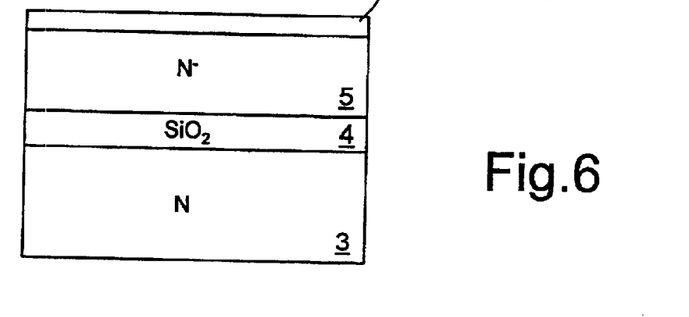
FIGS. 6–9 show cross-sections of intermediate structures that may be obtained using the manufacturing process according to the invention.

The surface region 13 and the junction region 14 form a PN junction, which is reverse-biased through the metal contacts 24, 25. For example, a voltage of 10–20 V can be applied between the surface region 13 and the junction region 14 by connecting the biasing regions 22 to ground and by biasing the surface region 13 at a negative voltage, so as to obtain a strong electric field concentrated on the PN junction 13–14, which forms an acceleration region, and an extensive depletion area beneath the PN junction, as may be seen in FIGS. 4 and 5, which respectively show the dopant profile and the plot of the electric field along a vertical sectional line drawn through the active region 12. The device is engineered in such a way that the sensitive region 19, which defines an absorption region, is comprised within the depletion area, and the trenches 10 laterally delimit the depletion region throughout the depth of the latter.

In practice, the PN junction 13–14 is reverse-biased at a voltage approaching the breakdown voltage. In this situation, no valence electrons are present in the depletion area, and possible electric currents linked to the movement of electrons are exclusively due to the incident light.

When a photon having a preset energy (determined by the rare earth present in the sensitive region 19) enters the active region 12, it does not interact with the surface region 13, junction region 14, and separation region 18, which are transparent to light, but may be captured by an erbium ion in the sensitive region 19, thus giving rise to a primary electron according to the indirect mechanism illustrated in FIGS. 1a–1c or to the direct mechanism illustrated in FIGS. 2a and 2b. The primary electron thus freed inside the sensitive region 19 is accelerated towards the surface region 13 by the electric field and, passing through the PN junction 13–14, may generate secondary electrons by impact, according to an avalanche process. Next, the primary and secondary electrons thus generated are picked up by the first metal contact 24. The PN junction 13–14 therefore behaves as a gain region, inside which the single primary electron generated by the impact of a photon gives rise to a cascade of secondary electrons, thus considerably increasing (up to 100 times) detection efficiency.

The photodetector 1 of FIG. 3 thus enables detection of light at preset wavelengths, which are determined by the specific rare earth used in the sensitive region 19, in a very efficient way, thanks to the exploitation of the avalanche effect and to the separation between the acceleration and gain region and the sensitive region.

The solution described in FIG. 3 is particularly suited for providing a waveguide integrated with other microelectronic devices, in so far as it is completely compatible with ULSI technology and clean-room processing, and thanks to its planar structure. In particular, for this application, the active region 12 and the trenches 10 preferably extend in length, in the Y direction of FIG. 3, for example from a few millimeters up to a few centimeters.

The photodetector of FIG. 3 is manufactured as described hereinafter with reference to FIGS. 6–9.

Initially (FIG. 6), the SOI substrate 2 is prepared, using one of the available technologies, such as separation-by-implantation-oxygen (SIMOX) technology, based upon implantation of oxygen atoms at a high dose, or bond-and-etchback SOI (BESOI) technology, based upon bonding of two monocrystalline-silicon wafers, one of which is oxidized beforehand on the bonding side, and upon thinning of the other silicon wafer down to the desired thickness.

Figure 7:
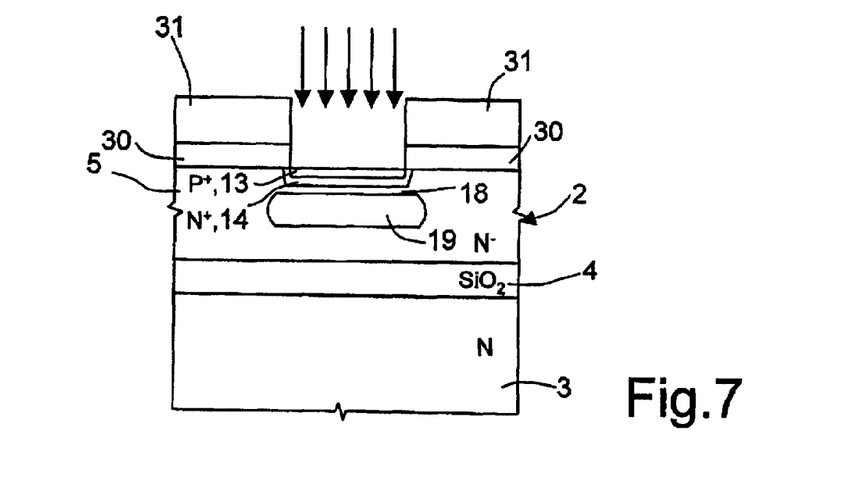

As indicated, the SOI substrate 2 comprises a first monocrystalline region 3, an oxide region 4, and a second monocrystalline region 5. Next, an oxide layer 30 is grown on top of the second monocrystalline region 5, and a first mask 31 is formed (FIG. 7). The uncovered portion of the oxide layer 30 is removed and, using the first mask 31, the sensitive region 19, the junction region 14, and the surface region 13 are implanted in sequence.

In particular, the surface region 13 can be obtained by implanting boron ions at an energy of 5–50 keV and a dose of $1 \times 10^{14} - 1 \times 10^{16}$ atoms/cm$^2$ so as to obtain a final doping level of $1 \times 10^{19} - 1 \times 10^{20}$ atoms/cm$^3$ and a depth of 0.1–0.15 $\mu$m. The junction region 14 is obtained by implanting preferably phosphorus ions or arsenic ions at an energy of approximately 80–150 keV and a dose of $1 \times 10^{14} - 1 \times 10^{16}$ atoms/cm$^2$ so as to obtain a final doping of $1 \times 10^{19} - 1 \times 10^{20}$ atoms/cm$^3$ and a depth of 0.15–0.2 $\mu$m. The sensitive region 19 is obtained by implanting erbium ions or holmium ions (according to the frequency that is to be detected by the photodetector) at an energy of approximately 0.5–2.5 MeV at doses of $1 \times 10^{12} - 1 \times 10^{14}$ atoms/cm$^2$ so as to obtain a peak final concentration of $1 \times 10^{16} - 1 \times 10^{18}$ atoms/cm$^3$. The sensitive region 19 extends to a depth of between approximately 0.4 and 1.5 $\mu$m from the surface 5a of the second monocrystalline region 5. The choice of the doping level of the sensitive region 19 derives from a compromise between two opposite requirements: on the one hand, as the doping level increases the efficiency of the photodetector 1 also increases, with a consequent increase in the probability of impact of the individual incident photons against the rare-earth ions, but, on the other hand, an excessive doping level would cause the sensitive region 19 to become of the N$^+$-type, with the consequence that this region could no longer be depleted and would thus give rise to current losses due to free electrons, thus impairing detection precision.

Figure 8:
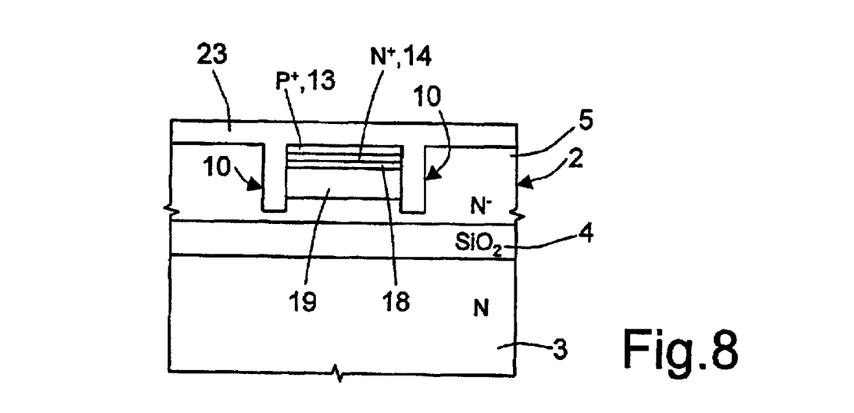

After removing the first mask 31, trenches 10 are formed down to a depth of at least 1.5 µm, by using a masked-etching process; then insulating material is deposited, which fills the trenches 10 (FIG. 8).

Next (FIG. 9), a second mask 32 is formed, the uncovered portions of the insulating layer 23 are removed, and an N-type doping agent, for instance arsenic or preferably phosphorus, is implanted to obtain the biasing regions 22. In particular, implanting is performed so that the biasing regions 22 have a depth at least roughly equal to that of the trenches 10 in order to reduce the resistance. For example, the arsenic implant may be performed at an energy of approximately 350 keV and a dose of $1\times10^{14}$–$1\times10^{16}$ atoms/cm$^2$ so as to obtain a peak final concentration of $1\times10^{18}$–$1\times10^{20}$ atoms/cm$^3$. In the case of phosphorus, the energy may be between 180 and 250 keV.

Figure 9:
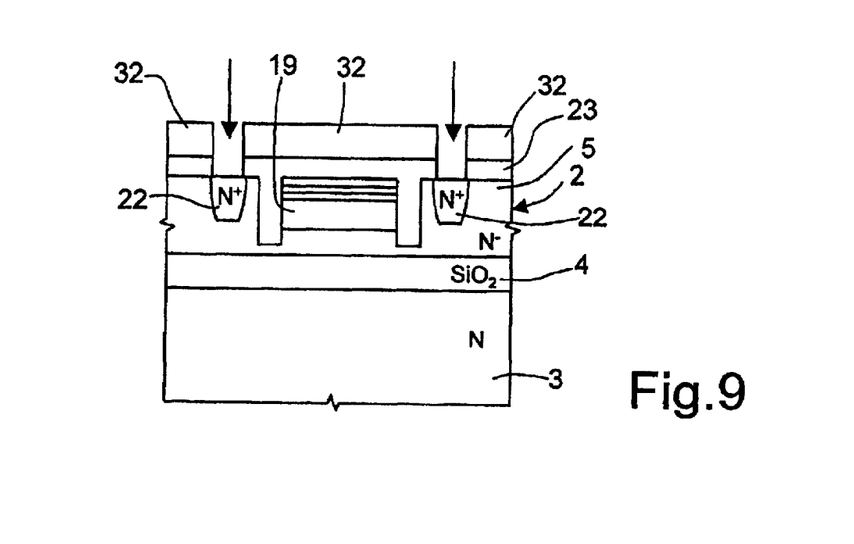

Next, an oxide layer is deposited, which, together with the previous insulating material, forms the insulating layer 23, and the insulating layer 23 is selectively opened where the metal contacts are to be made.

Finally, a metal layer (for instance, an aluminum layer) is deposited and is subsequently lithographically defined to form the first metal contact 24 and the second metal contacts 25. Thereby, the structure shown in FIG. 3 is obtained.

Figure 10:
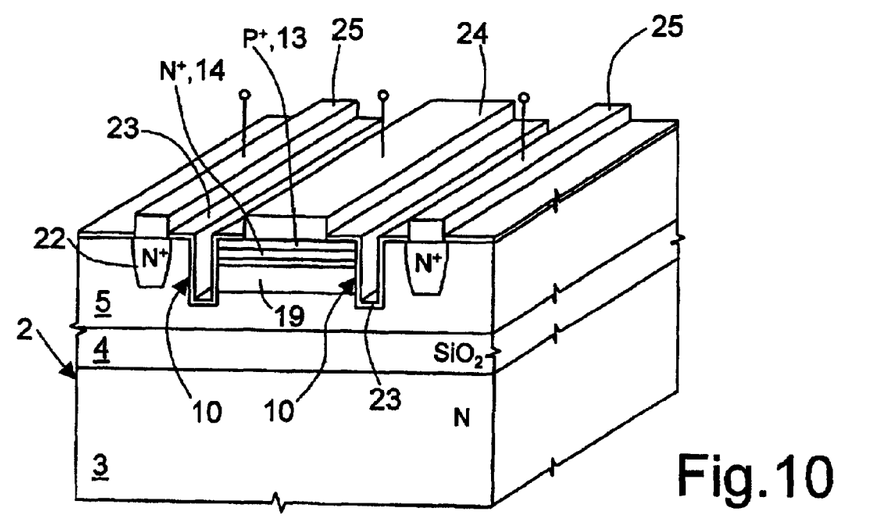
FIG. 10 shows a perspective cross-section of a second embodiment of the invention.

FIG. 10 shows a variant of the photodetector 1 of FIG. 3. In this case, the trenches 10 are not filled with insulating material, but the insulating layer 23 just covers the walls and bottom of the trenches 10.

Figure 11:
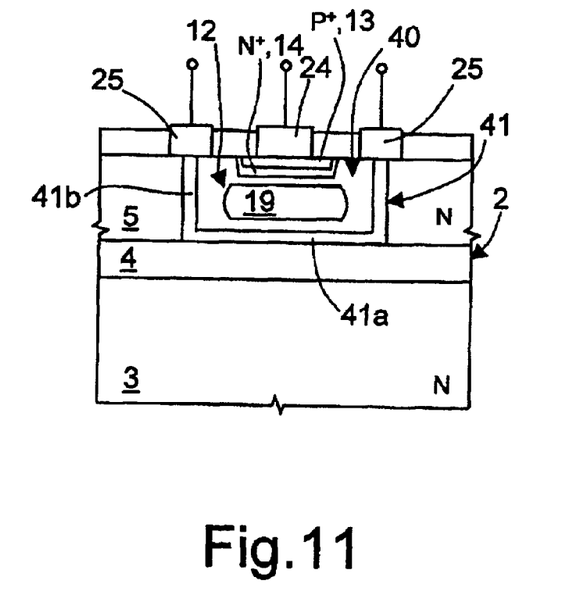
FIG. 11 shows a third embodiment of the invention.

FIG. 11 shows a different embodiment of the photodetector 1. In detail, in FIG. 11 the trenches 10 are not present, but the active region 12 is formed inside a first well 40 formed by the second monocrystalline region 5. The first well 40 is surrounded by a second well 41, of the N$^+$-type. In practice, the second well 41 electrically insulates the active region 12 from the remaining part of the second monocrystalline region 5, and comprises a bottom portion 41a which extends parallel, and next, to the oxide region 4, and side portions 41b which extend as far as the surface 5a of the second monocrystalline region 5 and are biased through the second metal contacts 25.

Figure 12:
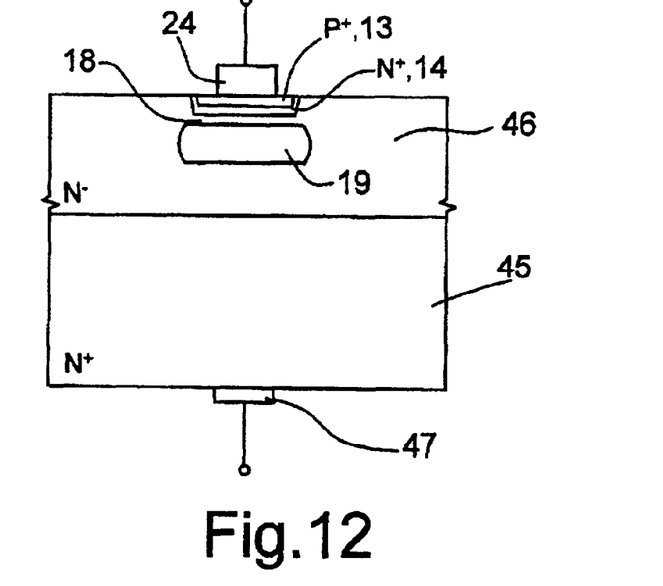
FIG. 12 shows a fourth embodiment of the invention.

FIG. 12 illustrates a different solution, suitable for manufacturing a discrete photodetector, which is formed in a body comprising a strongly doped substrate 45, of the N$^+$-type, and a weakly doped epitaxial layer 46, of the N$^-$-type. The active region 12 is formed in the epitaxial layer 46 and has the same structure as that shown in FIG. 3, except for the fact that no delimiting trenches are present. The second metal contact, here designated by 47, is formed on the rear of the wafer, in contact with the substrate 45, which is therefore equivalent, from the electrical standpoint, to the biasing regions 22 of FIG. 3. In practice, here the PN junction is formed by the base-emitter junction of a bipolar transistor.

Figure 13:
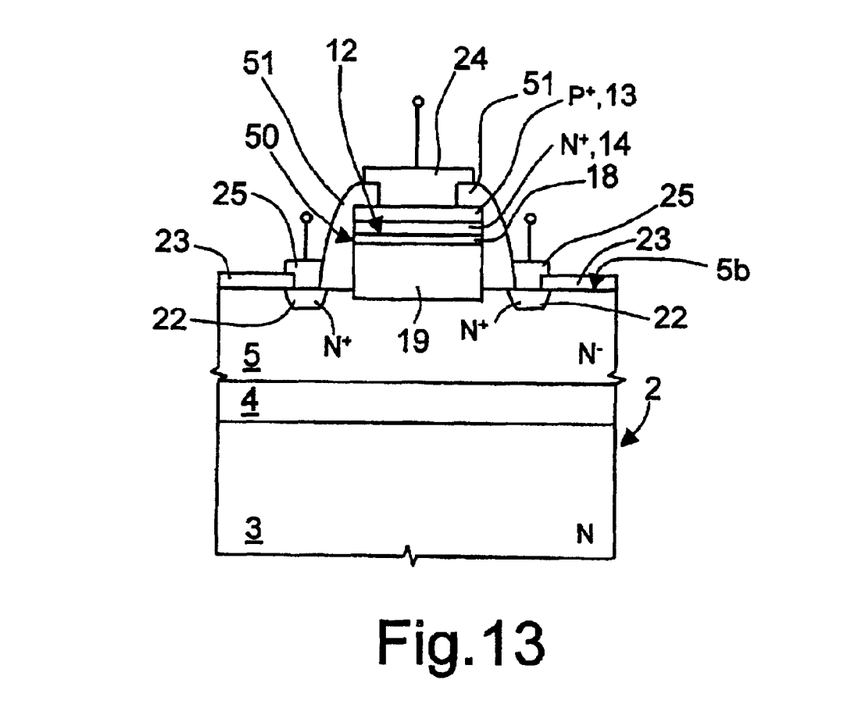
FIG. 13 shows a fifth embodiment of the invention.

Finally, FIG. 13 shows another solution wherein the active region 12 is formed in a projection 50 of the SOI substrate 2. In practice, the sensitive region 19, the separation region 18, the junction region 14, and the surface region 13 are formed above the level of the surface 5b of the second monocrystalline region 5 and are laterally protected by insulating regions 51. There are no trenches, and the biasing regions 22 are formed in the second monocrystalline region 5 alongside the projection 50.

The photodector of FIG. 13 is manufactured as follows: first, the active region 12 is formed in the SOI substrate 2; then, part of the second monocrystalline region 5 is selectively removed at the sides of the active region 12; the insulating regions 51 are formed; then the biasing regions 22 are formed; finally, the metal contacts 24, 25 are made.

Finally, it is clear that numerous modifications and variations may be made to the photodetector and to the manufacturing process described and illustrated herein, all falling within the scope of the invention, as defined in the attached claims. In particular, the body accommodating the active region may be made of a different semiconductor material, such as indium phosphide (InP) or gallium arsenide (GaAs), and may or may not comprise an insulating material region. The doping material of the sensitive region 19 depends upon the wavelength to be detected; in particular, it may be any type of doping impurity which introduces deep levels into the gap and levels suitable for transition at 0.8 or at 0.68 eV.

The acceleration region (PN junction) can simply be formed by a diode or the base-collector or base-emitter junction of a bipolar transistor.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A photodetector comprising a semiconductor material body housing a planer structure and housing a PN junction and a sensitive region that is doped with rare earths, said PN junction configured to form an acceleration and gain region separated from said sensitive region, wherein: said sensitive region extends beneath said acceleration and gain region; said acceleration and gain region is formed by a surface region of a first conductivity type and contiguous to a surface of the body, and by a junction region of a second conductivity type and a first doping level and extending beneath said surface region; said sensitive region has said second conductivity type and a second doping level, lower than said first doping level; said semiconductor-material body, beneath said sensitive region, has said second conductivity type and a third doping level, lower than said second doping level; and said acceleration and gain region and said sensitive region form an active region laterally delimited by trenches.

2. The photodetector according to claim 1, wherein said surface region is contiguous and electrically connected to a first contact region formed on top of said surface, and wherein biasing regions extend laterally and externally to said trenches, said biasing regions having said second conductivity type and a fourth doping level, higher than said second doping level, and being connected to second contact regions formed on top of said surface.

3. The photodetector according to claim 1, wherein said trenches are coated or filled with insulating material.

4. A photodetector comprising a semiconductor material body housing PN junction and a sensitive region that is doped with rare earths, said PN junction configured to form an acceleration and gain region separated from said sensitive region, wherein: said semiconductor-material body has a surface; said acceleration and gain region extends contiguously to said surface; said sensitive region extends beneath said acceleration and gain region; said acceleration and gain region and said sensitive region form an active region; said acceleration and gain region is formed by a surface region of a first conductivity type and contiguous to said surface, and by a junction region of a second conductivity type and a first doping level and extending beneath said surface region; said sensitive region has said second conductivity type and a second doping level, lower than said first doping level; said semiconductor-material body, beneath said sensitive region, has said second conductivity type and a third doping level, lower than said second doping level; said semiconductor-material body has a planar shape; said surface region is contiguous and electrically connected to a first contact region formed on top of said surface; said active region is formed in a first well having said second conductivity type and said third doping level; said first well being surrounded by a second well having said second conductivity type and a fourth doping level, higher than said second doping level; and said second well being contiguous and electrically connected to second contact regions formed on top of said surface.

5. The photodetector comprising a semiconductor material body housing a PN junction and a sensitive region that is doped with rare earths, said PN junction configured to form an acceleration and gain region separated from said sensitive region, wherein: said semiconductor-material body has a surface; said acceleration and gain region extends contiguously to said surface; said sensitive region extends beneath said acceleration and gain region; said acceleration and gain region and said sensitive region form an active region; said acceleration and gain region is formed by a surface region of a first conductivity type and contiguous to said surface, and by a junction region of a second conductivity type and a first doping level and extending beneath said surface region; said sensitive region has said second conductivity type and a second doping level, lower than said first doping level; said semiconductor-material body, beneath said sensitive region, has said second conductivity type and a third doping level, lower than said second doping level; said active region is formed in an epitaxial region having said second conductivity type and said third doping level and overlying a substrate region having said second conductivity type and a fourth doping level, higher than said third doping level; said body having a planar shape; and said surface region being contiguous and electrically connected to a firs contact region formed on top of said epitaxial region, and second contact regions extending beneath and being contiguous to said substrate region.

6. A process for manufacturing a photodetector, comprising the steps of:
forming a PN junction in a semiconductor-material body;
forming a sensitive region doped with rare earths in said semiconductor-material body;
separating said sensitive region from said PN junction by a separation layer; and
forming trenches at sides of said PN junction and said sensitive region.

7. The photodetector integrated in a semiconductor substrate, comprising:
a P-N junction that includes a P layer and an N layer;
a sensitive region doped with rare earths;
a separation layer positioned between, and different than, the P-N junction and the sensitive region; and
a pair of trenches delimiting the P layer, the N layer and the separation layer.

8. The photodetector of claim 7 further comprising a heavily-doped region of a first conductivity type positioned outside of the pair of trenches.

9. The photodetector of claim 7, further comprising an insulating layer positioned in each of the trenches.

10. The photodetector integrated in a semiconductor substrate, comprising:
a P-N junction that includes a P layer and an N layer;
a sensitive region doped with rare earths;
a separation layer positioned between, and different than, the P-N junction and the sensitive region; and
an insulating region to insulate the PN junction from another region of the semiconductor substrate, wherein the insulating region is a well of an N+ conductivity type formed in the substrate.

* * * * *

UNITED STATES PATENT AND TRADEMARK OFFICE
CERTIFICATE OF CORRECTION

| | |
|---|---|
| PATENT NO. | : 6,943,390 B2 |
| APPLICATION NO. | : 10/142264 |
| DATED | : September 13, 2005 |
| INVENTOR(S) | : Coffa et al. |

It is certified that error appears in the above-identified patent and that said Letters Patent is hereby corrected as shown below:

<u>Columns 6, 7, and 8</u>
"Claims 1-10", should be replaced with the following:
--What is claimed is:
1. A photodetector comprising a semiconductor material body having a planar structure and housing a PN Junction and a sensitive region that is doped with rare earths, said PN junction configured to form an acceleration and gain region separated from said sensitive region, wherein: said sensitive region extends beneath said acceleration and gain region; said acceleration and gain region is formed by a surface region of a first conductivity type and contiguous to a surface of the body, and by a junction region of a second conductivity type and a first doping level and extending beneath said surface region; said sensitive region has said second conductivity type and a second doping level, lower than said first doping level; said semiconductor material body, beneath said sensitive region, has said second conductivity type and a third doping level, lower than said second doping level; and said acceleration and gain region and said sensitive region form an active region laterally delimited by trenches.

2. The photodetector according to claim 1, wherein said PN junction is reverse-biased and generates a depletion region and said sensitive region extends within said depletion region.

3. The photodetector according to claim 1, wherein said semiconductor material is chosen from among silicon, indium phosphide and gallium arsenide.

4. The photodetector according to claim 1, wherein said sensitive region is doped with atoms chosen from the group consisting of erbium, holmium, neodymium and promethium 5. The photodetector according to claim 1, wherein said PN junction is farmed by a diode or is formed by a bipolar transistor.

6. The photodetector according to claim 1, wherein a separation region having said second conductivity type and said third doping level extends between said junction region and said sensitive region.

7. The photodetector according to claim 1, wherein said semiconductor-material body is formed by a monocrystalline region of a SOI substrate.

UNITED STATES PATENT AND TRADEMARK OFFICE
CERTIFICATE OF CORRECTION

| | |
|---|---|
| PATENT NO. | : 6,943,390 B2 |
| APPLICATION NO. | : 10/142264 |
| DATED | : September 13, 2005 |
| INVENTOR(S) | : Coffa et al. |

It is certified that error appears in the above-identified patent and that said Letters Patent is hereby corrected as shown below:

8. The photodetector according to claim 7, wherein said active region is formed in a projection of said monocrystalline region, said surface region is contiguous and electrically connected to a first contact region formed on top of said projection, and biasing regions extend in said monocrystalline region, at the sides of said projection, and are in direct electrical contact with second contact regions formed on top of said monocrystalline region.

9. The photodetector according to claim 1, wherein said surface region is contiguous and electrically connected to a first contact region formed on top of said surface, and wherein biasing regions extend laterally and externally to said trenches, said biasing regions having said second conductivity type and a fourth doping level, higher than said second doping level, and being connected to second contact regions formed on top of said surface.

10. The photodetector according to claim 1, wherein said trenches are coated or filled with insulating material.

11. A photodetector comprising a semiconductor material body housing a PN junction and a sensitive region that is doped with rare earths, said PN junction configured to form an acceleration and gain region separated from said sensitive region, wherein: said semiconductor-material body has a surface; said acceleration and gain region extends contiguously to said surface; said sensitive region extends beneath said acceleration and gain region; said acceleration and gain region and said sensitive region form an active region; said acceleration and gain region is formed by a surface region of a first conductivity type and contiguous to said surface, and by a junction region of a second conductivity type and a first doping level and extending beneath said surface region; said sensitive region has said second conductivity type and a second doping level, lower than said first doping level; said semiconductor-material body, beneath said sensitive region, has said second conductivity type and a third doping level, lower than said second doping level; said semiconductor-material body has a planar shape; said surface region is contiguous and electrically connected to a first contact region formed on top of said surface; said active region is formed in a first well having said second conductivity type and said third, doping level; said first well being surrounded by a second well having said second conductivity type and a fourth doping level, higher than said second doping level; and said second well being contiguous and electrically connected to second contact regions formed on top of said surface.

UNITED STATES PATENT AND TRADEMARK OFFICE
CERTIFICATE OF CORRECTION

PATENT NO. : 6,943,390 B2
APPLICATION NO. : 10/142264
DATED : September 13, 2005
INVENTOR(S) : Coffa et al.

It is certified that error appears in the above-identified patent and that said Letters Patent is hereby corrected as shown below:

12. A photodetector comprising a semiconductor material body housing a PN junction and a sensitive region that is doped with rare earths, said PN junction configured to form an acceleration and gain region separated from said sensitive region, wherein: said semiconductor-material body has a surface; said acceleration and gain region extends contiguously to said surface; said sensitive region extends beneath said acceleration and gain region; said acceleration and gain region and said sensitive region form an active region; said acceleration and gain region is formed by a surface region of a first conductivity type and contiguous to said surface, and by a junction region of a second conductivity type and a first doping level and extending beneath said surface region; said sensitive region has said second conductivity type and a second doping level, lower than said first doping level; said semiconductor-material body, beneath said sensitive region, has said second conductivity type and a third doping level, lower than said second doping level; said active region is formed in an epitaxial region having said second conductivity type and said third doping level and overlying a substrate region having said second conductivity type and a fifth doping level, higher than said third doping level; said body having a planar shape; and said surface region being contiguous and electrically connected to a first contact region formed on top of said epitaxial region, and second contact regions extending beneath and being contiguous to said substrate region.

13. A process for manufacturing a photodetector, comprising the steps of: forming, in a semiconductor-material body, a PN junction of a first region of a first conductivity type and a second region of a second conductivity type; forming a sensitive region doped with rare earths in said semiconductor-material body, and separating said sensitive region from said first and second regions by a separation layer.

14. The process according to claim 13, wherein said sensitive region is doped with atoms chosen from the group comprising erbium, holmium, neodymium, and promethium.

15. The process according to claim 13, further comprising the steps of: forming said first region, having a first conductivity type, in a semiconductor-material body having a second conductivity type; forming said second region, having said second conductivity type and a first doping level, in said semiconductor-material body beneath said surface region; and forming said sensitive region having said second conductivity type and a second doping level, lower than said first doping level, in said semiconductor-material body beneath said second region, said semiconductor-material body having said second conductivity type and a third doping level, lower than said second doping level.

UNITED STATES PATENT AND TRADEMARK OFFICE
CERTIFICATE OF CORRECTION

PATENT NO. : 6,943,390 B2
APPLICATION NO. : 10/142264
DATED : September 13, 2005
INVENTOR(S) : Coffa et al.

It is certified that error appears in the above-identified patent and that said Letters Patent is hereby corrected as shown below:

16. The process according to claim 15, wherein said step of forming said first region comprises implanting boron ions at an energy of 5-50 keV and a dose of $1 \times 10^{14}$-$1 \times 10^{16}$ atoms/cm$^2$ so as to obtain a final doping level of $1 \times 10^{19}$- $1 \times 10^{20}$ atoms/cm$^3$ and a depth of 0.1-0.15 µm; said step of forming said second region comprises implanting phosphorus ions or arsenic ions at an energy of 80-150 keV and a dose of $1 \times 10^{14}$-$1 \times 10^{16}$ atoms/cm$^2$ so as to obtain a final doping level of $1 \times 10^{19}$- $1 \times 10^{20}$ atoms/cm$^3$ and a depth of 0.15-0.2 µm; and said step of forming a sensitive region comprises implanting ions of rare earths at an energy of 0.5-2.5 MeV at doses of $1 \times 10^{12}$-$1 \times 10^{14}$ atoms/cm$^2$ so as to obtain a peak final concentration of $1 \times 10^{16}$- $1 \times 10^{18}$ atoms/cm$^3$.

17. A process for manufacturing a semiconductor, comprising the steps of: forming, in a semiconductor-material body, a junction of a first region of a first conductivity type and a second region of a second conductivity type; forming a sensitive region doped with rare earths in said semiconductor-material body; separating said sensitive region from said first and second regions by a separation layer; and forming trenches at sides of said junction and said sensitive region.

18. A photodetector integrated in a semiconductor substrate, comprising: a P-N junction that includes a P layer and an N layer a sensitive region doped with rare earths; and a separation layer positioned between, and different than, the layers of the P-N junction and the sensitive region.

19. The photodetector of claim 18, wherein the semiconductor substrate comprises an oxide layer.

20. The photodetector of claim 16 wherein the separation layer is of an N conductivity type.

21. A photodetector integrated in a semiconductor substrate, comprising: a P-N junction that includes a P layer and an N layer; a sensitive region doped with rare earths; a separation layer positioned between, and different than, the layers of the P-N Junction and the sensitive region; and a pair of trenches delimiting the P layer, the N layer and the separation layer.

22. The photodetector of claim 21 further comprising a heavily-doped region of a first conductivity type positioned outside of the pair of trenches.

UNITED STATES PATENT AND TRADEMARK OFFICE
CERTIFICATE OF CORRECTION

| | |
|---|---|
| PATENT NO. | : 6,943,390 B2 |
| APPLICATION NO. | : 10/142264 |
| DATED | : September 13, 2005 |
| INVENTOR(S) | : Coffa et al. |

It is certified that error appears in the above-identified patent and that said Letters Patent is hereby corrected as shown below:

23. The photodiode of claim 21, further comprising an insulating layer positioned in each of the trenches.

24. The photodetector of claim 18, further comprising an insulating region to insulate the P-N junction from another region of the semiconductor substrate.

25. A photodetector integrated in a semiconductor substrate, comprising: a P-N junction that includes a P layer and an N layer; a sensitive region doped with rare earths; a separation layer positioned between, and different than, the layers of the P-N junction and the sensitive region; and an insulating region to insulate the P-N junction from another region of the semiconductor substrate, wherein the insulating region is a well of an N+ conductivity type formed in the substrate.

26. The photodetector of claim 24, further comprising: first and second conductors electrically coupled to the insulating region; and a third conductor electrically coupled to the P layer.

27. The photodetector of claim 18, wherein the sensitive region is formed above a surface of a layer of the semiconductor substrate.--

Signed and Sealed this

Twelfth Day of December, 2006

JON W. DUDAS
*Director of the United States Patent and Trademark Office*